United States Patent
Park

(10) Patent No.: US 7,132,869 B2
(45) Date of Patent: Nov. 7, 2006

(54) ZERO IDLE TIME Z-STATE CIRCUIT FOR PHASE-LOCKED LOOPS, DELAY-LOCKED LOOPS, AND SWITCHING REGULATORS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 214 days.

(21) Appl. No.: 11/009,648

(22) Filed: Dec. 9, 2004

(65) Prior Publication Data

US 2006/0125534 A1     Jun. 15, 2006

(51) Int. Cl.
*H03K 3/02*     (2006.01)
(52) U.S. Cl. .................................. 327/198; 327/141
(58) Field of Classification Search ................ 327/141, 327/149, 156, 158, 198, 199, 147; 323/266, 323/901; 363/49
See application file for complete search history.

(56) References Cited

U.S. PATENT DOCUMENTS 6,807,075 B1 * 10/2004 Miermans .................... 363/49
6,940,322 B1 *  9/2005 Yang et al. ................. 327/147

\* cited by examiner

*Primary Examiner*—Linh My Nguyen

(57) ABSTRACT

The four types of the zero idle time Z-state circuits are presented with an improvement in productivity, cost, chip area, power consumption, and design time. The zero idle time Z-state circuits basically include a sensing gate, two stacked PMOS transistors, and a feedback line. The sensing gate senses a voltage at its input assuming no feedback is applied. Again, the corresponding output of two stacked PMOS transistors is assumed to be connected to the sensing input. Two stacked PMOS transistors generate a high impedance Z-state at its output according to the corresponding output of the sensing gate. Therefore, the feedback line keeps sampling the output and feeding back the output voltage to the sensing input. Consequently, the feedback configuration provides the initial output voltage, which is the midpoint voltage decided by the device aspect ratios of the sensing gate before normal operation starts in all three systems such as all kinds of phase-locked loops, delay-locked loops, and switching regulators. Thus, all the zero idle time Z-state circuits within all three systems make the initial condition close to the expected condition in order to enable these systems to come into lock or regulation quickly. Thus, all the zero idle time Z-state circuits utilizing less than twelve transistors presented achieve a fast lock-in time, a solution for harmonic locking problem, a minimization of start-up time, a initial reduction in power and time, a significant reduction in design simulation time, an improvement in productivity, and a higher performance.

20 Claims, 10 Drawing Sheets

No divider is assumed for simplicity!

ZERO IDLE TIME Z-STATE CIRCUIT FOR PHASE-LOCKED LOOPS, DELAY-LOCKED LOOPS, AND SWITCHING REGULATORS

FIELD OF THE INVENTION

The present invention relates to the field of zero idle time z-state circuit and more particularly to zero idle time z-state circuit for phase-looked loops, delay-locked loops, and switching regulators.

BACKGROUND ART

Phase-looked loops, delay-locked loops, and switching regulators are vitally important devices. Phase-looked loops, delay-locked loops, and switching regulators are analog and mixed signal building blocks used extensively in communication, networks, digital systems, consumer electronics, computers, and any other fields that require frequency synthesizing and high efficient voltage regulating functions.

The phase-looked loop is a very versatile building block suitable for a variety of frequency synthesis, clock recovery, and synchronization applications. Prior Art FIG. 1 illustrates a basic architecture of a conventional phase-locked loop. The conventional phase-locked loop 100 typically consists of a phase-frequency detector, a charge-pump, a low-pass filter, a voltage-controlled oscillator, and a frequency divider in a loop. However, to understand phase-locked loops, phase-locked loops without any frequency dividers in a loop will be considered here. The phase-frequency detector is a block that has an output voltage with an average value proportional to the phase difference between the input signal and the output of the voltage-controlled oscillator. The charge-pump either injects the charge into the low-pass filter or subtracts the charge from the low-pass filter, depending on the outputs of the phase-frequency detector. Therefore, change in the low-pass filter's output voltage is used to drive the voltage-controlled oscillator. The negative feedback of the loop results in the output of the voltage-controlled oscillator being synchronized with the input signal. As a result, the phase-locked loop is in lock.

In the conventional phase-locked loop of Prior Art FIG. 1, lock-in time is defined as the time that is required to attain lock from an initial loop condition. Assuming that the phase-locked loop bandwidth is fixed, the lock-in time is proportional to the initial difference frequency between the initial input signal frequency and the voltage-controlled oscillator's frequency as follows:

$$\frac{(\omega_{in} - \omega_{osc})^2}{\omega_0^3}$$

where $\omega_{in}$ is the input signal frequency, $\omega_{osc}$ is the voltage-controlled oscillator's frequency, and $\omega_0$ is the loop bandwidth. It should be noted that a loop bandwidth must be wide enough to obtain a fast lock-in time, unless the narrow bandwidth is inevitable to minimize output phase jitter due to external noise. If the loop bandwidth of a phase-locked loop is very narrow, the lock-in time is very slow. Modern communication systems require a fast lock-time time even though the loop bandwidth is narrow. However, the conventional phase-locked loops including Prior Art FIG. 1 have suffered from slow locking. Time and power are unnecessarily consumed until the phase-locked loops are in lock. To overcome the drawbacks, a conventional fast-locking phase-locked loop of Prior Art FIG. 2 is illustrated. The conventional fast-locking phase-locked loop consists of a digital phase-frequency detector including a 6-bit counter, a proportional-integral controller, a 10-bit digital-to-analog converter, and a voltage-controlled oscillator. Unfortunately, the conventional fast-locking phase-locked loop is costly, complicated, and inefficient in an integrated circuit (IC) because additional blocks such as the proportional-integral controller and the 10-bit digital-to-analog converter take much more chip area and consume much more power. Since there are much more functional blocks integrated on the same chip, the chip area of the conventional fast-locking phase-locked loop 200 is about three times as large as that of the conventional phase-locked loop 100. In addition, complicated additional functional blocks in a loop make the stability analysis very difficult. The complexity increases the number of blocks that need to be designed and verified. Thus, the conventional fast-locking phase-locked loop of Prior Art FIG. 2 might improve the lock-in time, but definitely results in the following penalties: bad productivity, higher cost, larger chip area, much more power consumption, and longer design time. Therefore, the conventional fast-locking phase-locked loop 200 can not be implemented in an integrated circuit (IC). In addition to slow lock-in time problem, there have been serious harmonic locking problems when a multiplier is used for the phase detector.

Thus, what is desperately needed is a phase-locked loop integrated circuit that can attain a fast lock-in time and solve serious harmonic locking problems with an improvement in productivity, cost, chip area, power consumption, and design time. The present invention satisfies these needs by providing zero idle time Z-state circuits utilizing a small number of transistors.

Delay-looked loops are typically employed for the purpose of synchronization. Prior Art FIG. 3 illustrates a basic architecture of a conventional delay-locked loop. A conventional delay-locked loop 300 typically consists of a phase detector, a charge-pump, a loop filter, and a voltage-controlled delay line. In delay-locked loops, the phase detector is a block that has an output voltage with an average value proportional to the phase difference between the input signal clock and the output clock at the end of delay line. The charge-pump either injects the charge into the loop filter or subtracts the charge from the loop filter, depending on the outputs of the phase detector. Therefore, change in the loop filter's output voltage will affect the delay time of the voltage-controlled delay line. If delay different from integer multiples of clock period is detected, the closed delay-locked loop will automatically correct it by changing the delay time of the voltage-controlled delay line. However, conventional delay locked-loops have suffered from harmonic locking over wide operating range or failing to lock. To overcome the drawbacks, a conventional fast-locking delay-locked loop of Prior Art FIG. 4 is illustrated. The conventional fast-locking delay-locked loop 400 basically consists of an analog phase detector, a charge-pump, a loop filter, a voltage-controlled delay lines, a digital phase detector, a 2-bit successive-approximation register (SAR), and a DCDL. Unfortunately, the conventional fast-locking delay-locked loop is costly, complicated, and inefficient in an integrated circuit (IC) because additional blocks such as the DCDL and 2-bit successive-approximation register (SAR) take much more chip area and consume much more power. Since there are much more functional blocks integrated on the same chip, the chip area of the conventional fast-locking delay-locked loop 400 is about 2.6 times as large as that of the conventional delay-locked loop 300. The complexity increases the number of blocks that need to be designed and verified. Thus, the conventional fast-locking delay-locked loop of Prior Art FIG. 4 might improve the lock-in time, but certainly results in the following penalties: bad productivity, higher cost, larger chip area, much more power consumption, and longer design time. Thus, the conventional fast-locking delay-locked loop 400 can not be implemented in an integrated circuit (IC). In addition to slow lock-in time problem, there have been serious lock failure problems.

Thus, what is desperately needed is a delay-locked loop integrated circuit that can attain a fast lock-in time and solve lock failure problems with an improvement in productivity, cost, chip area, power consumption, and design time. At the same time, what is desperately needed is to add one circuit that enables both phase-locked loops and delay-locked loops to achieve fast lock and to eliminate lock failure and harmonic locking problems. The present invention satisfies these needs by providing zero idle time Z-state circuits utilizing a small number of transistors, too.

Switching regulators (DC-TO-DC converters) are typically used for high efficient power supply system. Switching regulators can provide output voltages which can be less than, greater than, or of opposite polarity to the input voltage. Prior Art FIG. 5 illustrates a basic architecture of a conventional switching regulator 500. The conventional switching regulator basically consists of an oscillator, a reference circuit, an error amplifier, a modulator including a comparator, resistors, and a control logic circuit. Control technique of switching regulators has typically used two modulators: a pulse-width modulator and a pulse-frequency modulator. For pulse-width modulator, the output dc level is sensed through the feedback loop including two resistors. An error amplifier compares this sampled output voltage and the reference voltage. The output of the error amplifier is compared against a periodic ramp generated by the saw tooth oscillator. The pulse-width modulator output passes through the control logic to the high voltage power switch. The feedback system regulates the current transfer to maintain a constant voltage within the load limits. In other words, it insures that the output voltage comes into regulation. Unfortunately, the conventional switching regulator 500 is inefficient in an integrated circuit (IC). The reason why is that it takes a long time until the regulated output reaches the equilibrium after the power supply or the power system starts. Thus, power and time are wasted until the output voltage comes into regulation. In addition, the slow start-up increases design simulation time.

In summary, unfortunately the conventional phase-locked loop 100 of Prior Art FIG. 1, the conventional fast-locking phase-locked loop 200 of Prior Art FIG. 2, the conventional delay-locked loop 300 of Prior Art FIG. 3, the conventional fast-locking delay-locked loop 400 of Prior Art FIG. 4, and the conventional switching regulator 500 of Prior Art FIG. 5 are very inefficient and unreliable to implement in an integrated circuit. In addition, those integrated circuits 100, 200, 300, 400, and 500 have taken a long time to be simulated and verified before they are fabricated. Also, many other additional drawbacks are described as follows: First, the conventional phase-locked loops 100 and conventional delay-locked loop 300 have suffered from a very long time required to attain lock. Hence, time and power are unnecessarily consumed until the conventional phase-locked loop 100 and conventional delay-locked loop 300 are in lock. Second, the conventional phase-locked loop 100 has suffered from harmonic locking and the conventional delay-locked loop 300 has suffered from failing to lock. Especially harmonic locking is that the phase-locked loop locks to harmonics of the input signal when a multiplier is used for the phase detector. Third, the conventional switching regulator 500 has suffered from long time to require the output voltage to be regulated. Fourth, simulation time in designing these integrated circuits is absolutely proportional to time required the loops to lock and time to require the output voltage of the switching regulators to be regulated. Hence, this long simulation time adds additional cost to the integrated circuit (IC) and slows down design time to market. Fifth, the conventional locked loops and the conventional switching regulators do not have common analog building block to reduce the number of different blocks that need to be designed and verified. As a result, regularity and productivity can not be achieved. Sixth, the conventional fast-locking phase-locked loop 200 and conventional fast-locking delay-locked loop 400 might improve the lock-in time, but definitely results in bad productivity, higher cost, larger chip area, much more power consumption, and longer design time.

Thus, what is finally needed for a cost-effective circuit that can make a fast lock-in time for phase-locked loops and delay-locked loops, resolve harmonic locking for phase-locked loops, prevent delay-locked loops from failing to lock, minimize start-up time of switching regulators, reduce power and time consumption until loops are in lock or the output voltage of switching regulators comes into regulation, reduce significantly design time for better time-to-market, and improve productivity by reusing the same cost-effective circuit design for three applications such as phase-locked loops, delay-locked loops, and switching regulators. The present invention satisfies these needs by providing four embodiments utilizing a small number of transistors.

SUMMARY OF THE INVENTION

The present invention provides four types of the zero idle time Z-state circuits. The zero idle time Z-state circuits simultaneously enable three systems to be three high efficient reliable zero idle time systems such as zero idle time phase-locked loops, zero idle time delay-locked loops, and zero idle time switching regulators. The simplest zero idle time Z-state circuit of the present invention includes only six transistors. The first concept of the zero idle time Z-state circuits is a substantial reduction in the difference between the initial condition and the expected condition in three systems such as phase-locked loops, delay-locked loops, and switching regulators. The second concept is to utilize a charging mode and a discharging mode of these three systems. The basic architecture of the zero idle time Z-state circuits consists of a sensing gate, two stacked PMOS transistors, and a feedback line. The sensing gate senses a voltage at its input and two stacked PMOS transistors generate a high impedance Z-state at its output according to the corresponding output of the sensing gate. The feedback line keeps sampling the output and feeding back the output voltage to the sensing input. Consequently, the feedback configuration provides the initial output voltage, which is the midpoint voltage decided by the device aspect ratios of the sensing gate before normal operation starts in these three systems. All zero idle time Z-state circuits cause a substantial reduction in the difference between the initial condition and the expected condition in order to solve many drawbacks simultaneously. In addition, the present invention has four different embodiments with an improvement in productivity, cost, chip area, power consumption, and design time. One embodiment does not use power-down mode, whereas three embodiments utilize power-down mode.

BRIEF DESCRIPTION OF THE DRAWINGS

The accompanying drawings, which are incorporated in and form a part of this specification, illustrate four embodiments of the invention and, together with the description, serve to explain the principles of the invention.

Prior Art

Prior Art

Prior Art

Prior Art

Prior Art

DESCRIPTION OF THE PREFERRED EMBODIMENTS

In the following detailed description of the present invention, four types of the zero idle time Z-state circuits, numerous specific details are set forth in order to provide a through understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
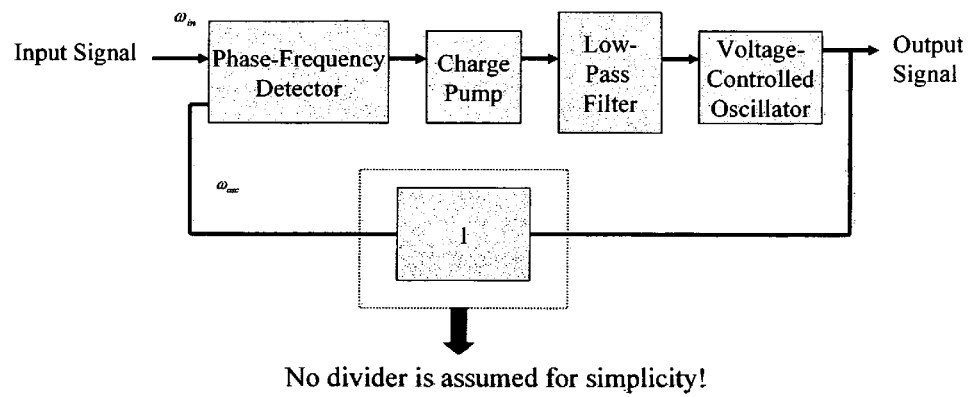
FIG. 1 illustrates a circuit diagram of a conventional phase-locked loop.
Figure 2:
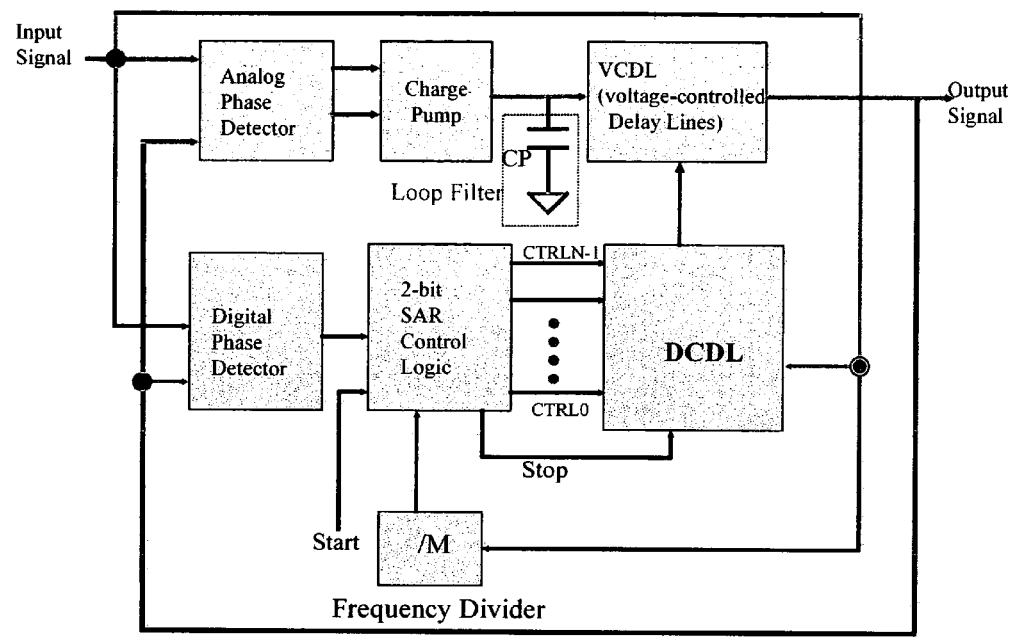
FIG. 2 illustrates a circuit diagram of a conventional fast-locking phase-locked loop.
Figure 3:
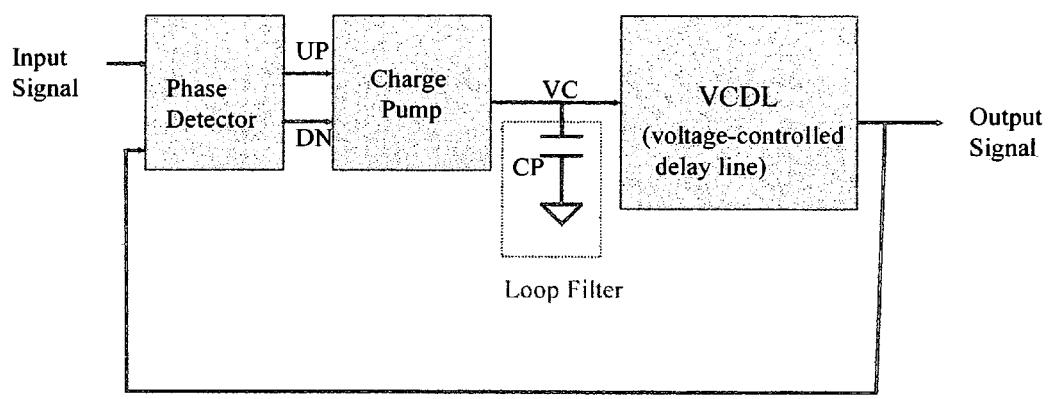
FIG. 3 illustrates a circuit diagram of a conventional delay-locked loop.
Figure 4:
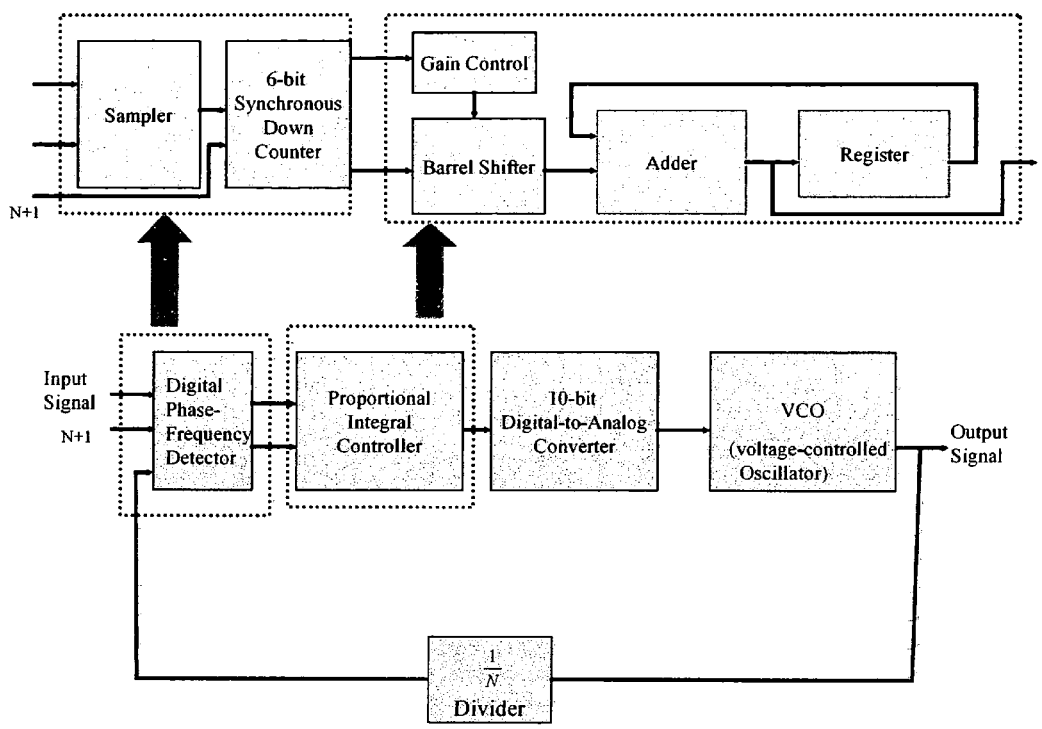
FIG. 4 illustrates a circuit diagram of a conventional fast-locking delay-locked loop.
Figure 5:
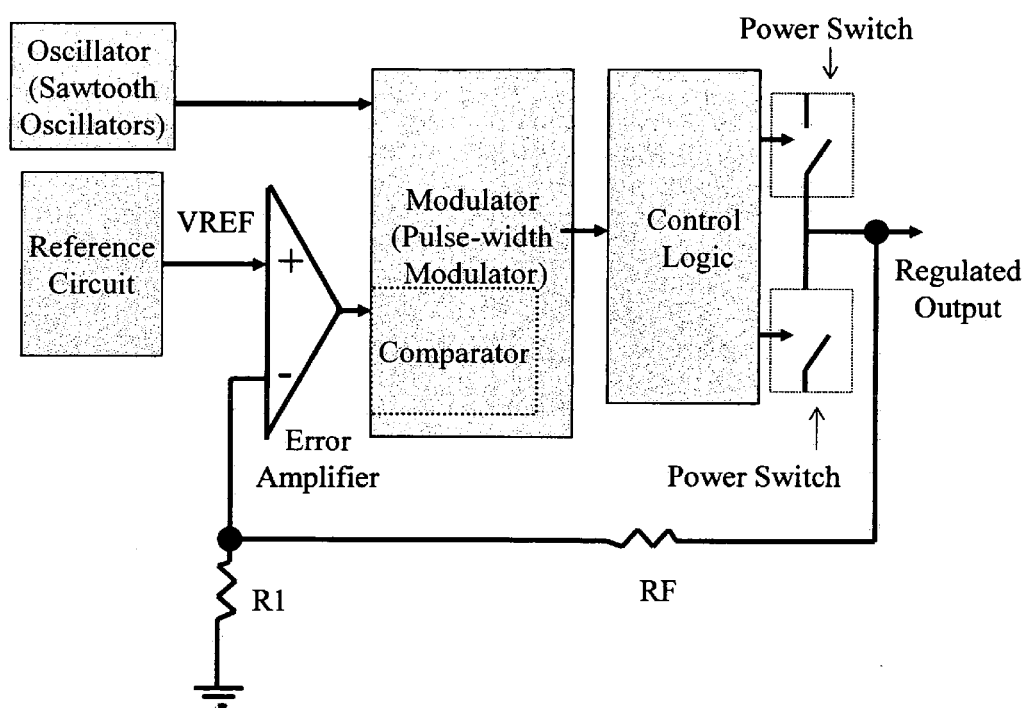
FIG. 5 illustrates a circuit diagram of a conventional switching regulator (DC-TO-DC converter).
Figure 6:
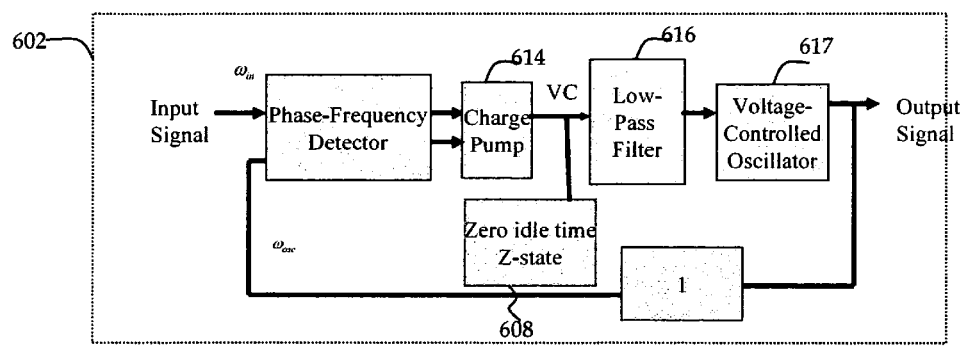
FIG. 6 illustrates a diagram of three systems using a zero idle time Z-state circuit in accordance with the present invention.
Figure 6:
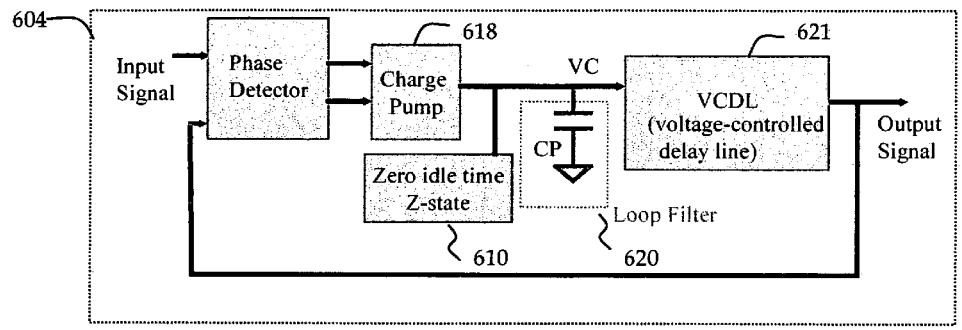
Figure 6:
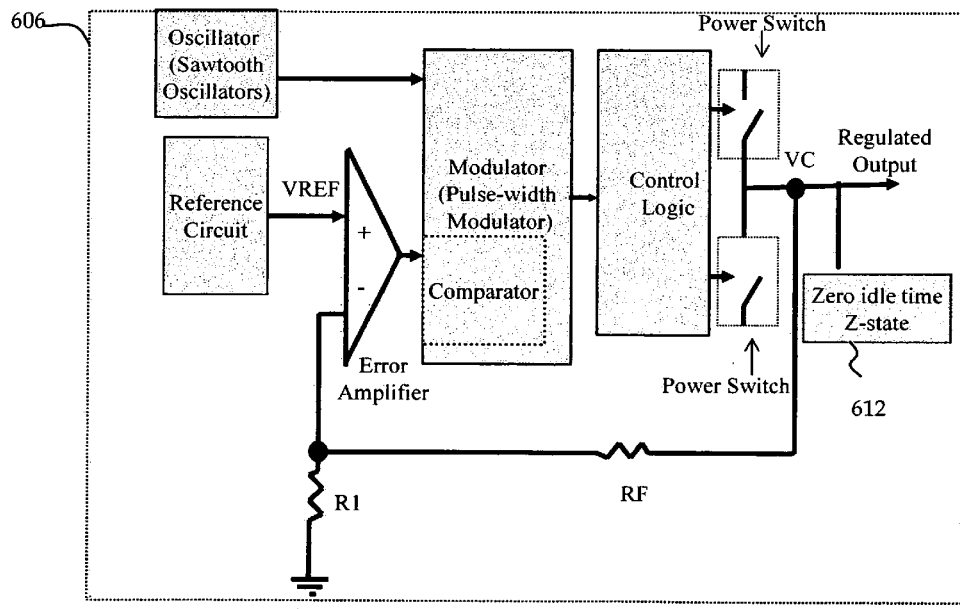

FIG. 6 illustrates three systems using the same zero idle time Z-state circuit in accordance with the present invention. It is noted that the zero idle time Z-state blocks 608, 610, 612 are the same one used for three systems 602, 604, and 606 such as zero idle time phase-locked loop 602, zero idle time delay-locked loop 604, and zero idle time switching regulator 606. The zero idle time Z-state circuits 700, 800, 900, and 1000 of the present invention basically enables conventional phase-locked loop systems to be cost-effective fast-locking wide-tuning phase-locked loop systems, conventional delay-locked loop systems to be cost-effective fast-locking delay-locked loop systems, and conventional switching regulator systems to be cost-effective fast starting switching regulator systems. In addition, the zero idle time Z-state circuits 700, 800, 900, and 1000 of the present invention make an improvement in productivity, cost, chip area, power consumption, and design time.

First, to reduce the initial difference between input signal's frequency and the voltage-controlled oscillator's frequency by affecting the voltage-controlled oscillator 617 initially, the output of the zero idle time Z-state circuit 608 is coupled to the node connected to a charge-pump 614 and a low-pass filter 616, as seen in the zero idle time phase-locked loop 602 shown in FIG. 6. Second, to reduce the initial difference between input signal's frequency and voltage-controlled delay line's frequency by affecting the voltage-controlled delay line initially, the output of the zero idle time Z-state circuit 610 is coupled to the node connected to a charge-pump 618 and a loop filter 620, as seen in the zero idle time delay-locked loop 604 shown in FIG. 6. Third, to reduce the difference between the initial output voltage and the expected output voltage of the switching regulator, the output of the zero idle time Z-state circuit 612 is coupled to the output of the zero idle time switching regulator 606, as shown in FIG. 6. The reason why the same zero idle time Z-state circuit of the present invention can be used for three different applications is that three systems 602, 604, and 606 possess a charging mode and a discharging mode until they come into lock or regulation. All zero idle time Z-state circuits of the present invention uses a small number of transistors.

Filters are well known circuits in the art and can be implemented using two configurations: one filter connected to ground and $V_C$ and the other filter connected to $V_{DD}$ and $V_C$. In addition, voltage-controlled oscillators (or voltage-controlled delay lines) are well known circuits in the art and can be implemented using two configurations: one whose frequency increases proportionally to $V_C$ and the other whose frequency decreases proportionally to $V_C$. One of the popular configurations suitable for implementation of the present invention is to use a filter connected to ground and $V_C$ with a voltage-controlled oscillator (or a voltage-controlled delay line) whose frequency increases proportionally to $V_C$. The other is to use a filter connected to $V_{DD}$ and $V_C$ with a voltage-controlled oscillator (or a voltage-controlled delay line) whose frequency decreases proportionally to $V_C$. To determine the configuration, one should consider minimizing any noise into the substrate or power supply.

Figure 7:
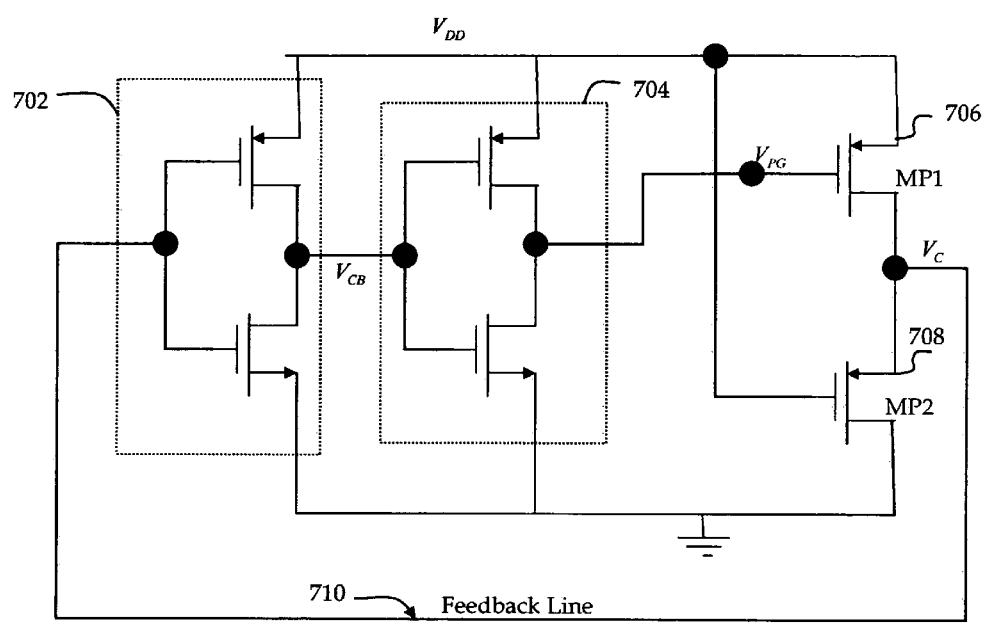
FIG. 7 illustrates a circuit diagram of a simple zero idle time Z-state circuit according to the present invention.

FIG. 7 illustrates a circuit diagram of a simple zero idle time Z-state circuit 700 according to the present invention. This simple zero idle time Z-state circuit 700 is the simplest circuit among four embodiments of the invention. In practice, the simple zero idle time Z-state circuit 700 is a feedback circuit that consists of a sensing inverter (an odd numbers of inverters), an inverter, two stacked PMOS transistors 706 and 708, and a feedback line 710. In addition, it should be aware that the gate of the lower PMOS transistor 708 is connected to $V_{DD}$ in order to turn off the lower PMOS transistor 708. The simple zero idle time Z-state circuit 700 is shown in FIG. 7, where $V_C$ is the input (=output) voltage with feedback 710 applied. First, assuming that feedback 710 is not present and thus the input and output are not tied together. In other words, the input and output without feedback 710 applied are the input of the sensing inverter 702 and output of two PMOS transistors 706 and 708, respectively. The sensing inverter 702 senses a voltage at its input. However, the input voltage is zero initially when the system is started. Since the input voltage of the sensing inverter 702 is zero, the output of the sensing inverter 702 is at $V_{DD}$. Thus, the output of the second inverter 704 is at ground to turn on the upper PMOS transistor 706, which provides an output pull-up path to $V_{DD}$ so that the output is at $V_{DD}$. Second, the output of two stacked PMOS transistors 706 and 708 is assumed to be connected to the input of the sensing inverter 702. Since the input voltage of the sensing inverter 702 is $V_{DD}$, the output voltage of the sensing inverter 702, $V_{CB}$, is zero and thus the output voltage of the second inverter 704, $V_{PG}$, is $V_{DD}$ to turn off the upper PMOS transistor 706. At this moment, two PMOS transistors 706 and 708 are off and the output is referred to as being in a high impedance Z-state. In other words, the output becomes a high impedance node that has no driving capability. However, in reality, it is noted that feedback 710 is applied in the simple zero idle time Z-state circuit 700 of the present invention. Thus, the feedback keeps sampling the output and feeding back the output voltage to the sensing input. Consequently, the simple zero idle time Z-state circuit 700 in the feedback configuration provides the initial $V_C$, which is the midpoint voltage decided by the device aspect ratios of the sensing inverter. It is of interest to note that the output voltage of the sensing inverter 702, $V_{CB}$, becomes nearly equal to $$\frac{V_{DD}}{2}$$

and the output voltage of the second inverter 704, $V_{PG}$, is close to $V_{DD}-V_T$. As a result, a very small amount of current from the drain of the upper PMOS transistor 706 flows into a load while no current flows into the source of the lower PMOS transistor 708. For application of the simple zero idle time Z-state circuit 700 shown in FIG. 7, the load is a filter connected to ground and $V_C$ for all kinds of phase-locked loops and delay-locked loops. It was just stated that the initial $V_C$ is determined by the device aspect ratios of the sensing inverter 702. The midpoint voltage is a voltage where the input voltage and the output voltage of the inverter are equal in the voltage transfer characteristic. At the midpoint voltage, the transistors of the inverter operate in the saturation mode. This midpoint voltage of inverter is expressed as $$\frac{V_{DD}-V_{T_n}-|V_{T_p}|}{1+\sqrt{\frac{K_n}{K_p}}}+V_{T_n} \text{ where } \frac{K_n}{K_p}=\frac{\mu_n C_{OX}\left(\frac{W}{L}\right)_n}{\mu_p C_{OX}\left(\frac{W}{L}\right)_p}.$$

If the simple zero idle time Z-state circuit 700 is not used within the systems 602, 604, and 606, the values of $V_{PG}$ and $V_{CB}$ are not affected by the $V_C$ initially decided by the device aspect ratios of the sensing inverter 702 in the stand-alone simple zero idle time Z-state circuit assuming the widths and lengths of two PMOS transistors 706 and 708 are taken as equal. However, since the simple zero idle time Z-state circuit 700 is used within the systems 602, 604, and 606 shown in FIG. 6, the values of $V_{PG}$ and $V_{CB}$ as well as $V_C$ will be affected after zero idle time phase-locked loops, zero idle time delay-locked loops, or zero idle time switching regulators begin to operate normally. The initial $V_C$ will cause a substantial reduction in the difference between the initial condition and the expected condition within the systems 602, 604, and 606.

It is a good idea to use a value for the midpoint voltage less than the voltage that makes the voltage-controlled oscillator's frequency (or the voltage-controlled delay line's frequency) equal to the input signal's frequency in the configuration where the voltage-controlled oscillator's frequency increases proportionally to $V_C$ formed from a filter connected to ground and $V_C$. Specifically, it must be around $V'_C-200$ mV where $V'_C$ is $V_C$ that makes the voltage-controlled oscillator's frequency (or the voltage-controlled delay line's frequency) equal to the input signal's frequency or makes the output voltage of the switching regulators equal to the regulated output voltage. In order that the proper value of the midpoint voltage be chosen, the CMOS process variations usually must be considered. In addition, each bulk of two PMOS transistors 706 and 708 can be connected to its own N-well to obtain better immunity from substrate noise.

In practice, the simple zero idle time Z-state circuit of the present invention is used within the systems 602, 604, and 606. Assuming that three systems 602, 604, and 606, shown in FIG. 6, does not have power-down mode, the phase-locked loop 602 including the simple zero idle time z-state circuit 700 used for the block 608 can be specifically termed the zero idle time phase-locked loop 602. Likewise, the delay-locked loop 604 and the switching regulator 606 including the simple zero idle time z-state circuit 700 used for the block 608 can be specifically called the zero idle time delay-locked loop 604 and the zero idle time switching regulator 606, respectively.

The simple zero idle time Z-state circuit 700 within the systems 602, 604, and 606 exhibits three desirable features as follows: 1. The frequency of the voltage-controlled oscillator is forced to be closer to the input signal's frequency so that the zero idle time phase-locked loop becomes quickly locked. 2. The frequency of the voltage-controlled delay line is forced to be closer to the input signal's frequency so that the zero idle time delay-locked loop is quickly locked. 3. The initial output voltage of the switching regulator is forced to be closer to its regulated output voltage so that the zero idle time switching regulator quickly comes in regulations. The systems including the simple zero idle time Z-state circuit 700 have the following advantages: a fast lock-in time for phase-locked loops and delay-locked loops, a solution for harmonic locking problem of phase-locked loops, a prevention of delay-locked loops from failing to lock, a minimization of start-up time of switching regulators, a reduction in power and time consumption until lock or regulation, a significant reduction in design time for better time-to-market, a higher performance, and an improvement in productivity by reusing the same cost-effective circuit for three zero idle time systems such as zero idle time phase-locked loop 602, zero idle time delay-locked loop 604, and zero idle time switching regulator 606. The present invention offers the above advantages by simply providing a simple zero idle time z-state circuit 700 utilizing only six transistors that all require smaller sizes of the lengths and widths of the transistor. It is noted that SPICE is used for the simulation of phase-locked loops. The conventional phase-locked loop 100 and the zero idle time phase-locked loop 602 are simulated using the same blocks except the zero idle time z-state circuit 700. As a result, the total simulation time of the conventional phase-locked loop 100 is 20 hours and that of the zero idle time phase-locked loop 602 is 2 hours. This improvement can be accomplished by simply inserting a simple zero idle time z-state circuit 700 into a conventional phase-locked loop 100, and the simulation time has been reduced by a factor of 10. Likewise, for delay-locked loops and switching regulators, the simulation time has been reduced by a factor of 10.

Figure 8:
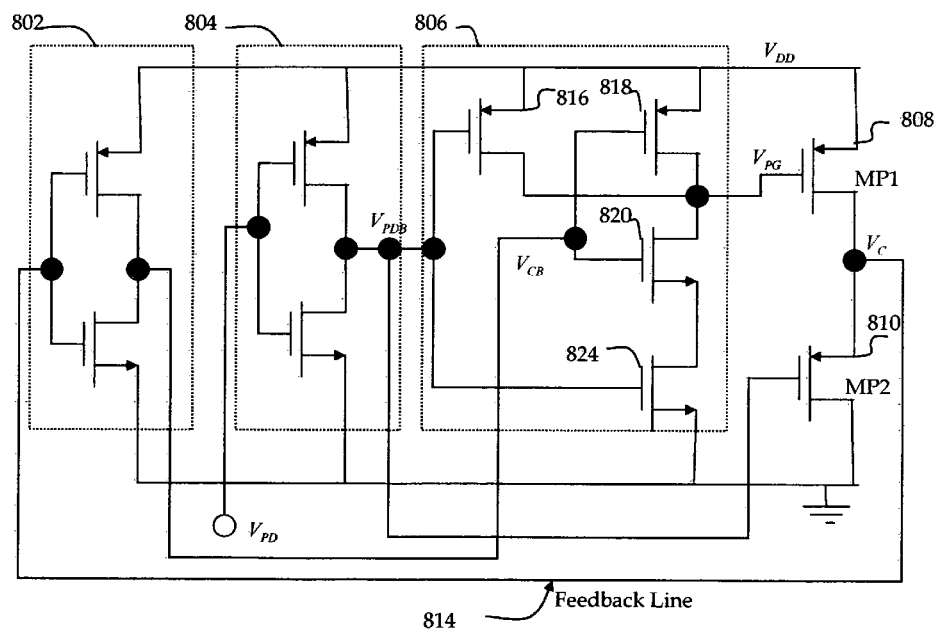
FIG. 8 illustrates a circuit diagram of a power-down enable zero idle time Z-state circuit in accordance with the present invention.

FIG. 8 illustrates a circuit diagram of a power-down enable zero idle time Z-state circuit 800 in accordance with the present invention. This power-down enable zero idle time Z-state circuit 800 is a power-down enable embodiment of the invention. The power-down input voltage, $V_{PD}$, is defines as the input voltage for the power down mode. The power-down enable system is in power down mode when $V_{PD}$ is $V_{DD}$ and it is in normal mode when $V_{PD}$ is zero. The power-down enable zero idle time Z-state circuit 800 is a feedback circuit that consists of a sensing inverter (an odd number of sensing inverters) 802, a power-down inverter 804, a NAND gate 806, two stacked PMOS transistors 808 and 810, and a feedback line 814. The power-down enable zero idle time Z-state circuit 800 is shown in FIG. 8, where $V_C$ is the input (=output) voltage with feedback applied. First, it is assumed that feedback 814 is not present and thus the input and output are not the same. In other words, the input and output without feedback 814 applied are the input of the sensing inverter 802 and output of two PMOS transistors 808 and 810, respectively. The sensing inverter 802 senses a voltage at its input when the circuit mode changes from power-down mode to normal mode after its start-up. Since the input voltage of the power-down inverter 804, $V_{PD}$, becomes zero during normal mode, the output voltage of the power-down inverter 804, $V_{PDB}$, is $V_{DD}$. At the same time, since the input of the sensing inverter 802 initially is at ground, the output of the sensing inverter 802 becomes at $V_{DD}$. It is noted that since the gate voltage of the lower PMOS transistor 810, $V_{PDB}$, is $V_{DD}$, the lower PMOS transistor 810 is off during normal mode. With two input voltages, $V_{PDB}=V_{DD}$ and $V_{CB}=V_{DD}$, the output of the CMOS NAND gate 806 is at ground to turn on the upper PMOS transistor 808, which provides an output pull-up path to $V_{DD}$ so that the output is at $V_{DD}$. Second, the output of two stacked PMOS transistors 808 and 810 is assumed to be connected to the input of the sensing inverter 802. Since the input voltage of the sensing inverter 802 is $V_{DD}$, the output voltage of the sensing inverter 802, $V_{CB}$, is zero. With two input voltages, $V_{PDB}=V_{DD}$ and $V_{CB}=0$, the output of the CMOS NAND gate 806 is at $V_{DD}$ to turn off the upper PMOS transistor 808. At this moment, two PMOS transistors 808 and 810 are off and the output is referred to as being in a high impedance Z-state. Thus, the output becomes a high impedance node that has no driving capability. However, in reality, it is noted that feedback 814 is applied in the power-down enable zero idle time Z-state circuit 800 of the present invention. Thus, the feedback line 814 keeps sampling the output and feeding back the output voltage to the sensing input. Consequently, the power-down enable zero idle time Z-state circuit 800 in the feedback configuration provides the initial $V_C$, which is the midpoint voltage decided by the device aspect ratios of the sensing inverter 802. In addition, it is of interest to note that the output voltage of the sensing inverter 802, $V_{CB}$, becomes nearly equal to $$\frac{V_{DD}}{2}$$

and the gate voltage of the upper PMOS transistor 808, $V_{PG}$, is close to $V_{DD}-V_T$. As a result, a very small amount of current from the drain of the upper PMOS transistor 808 flows into a load while no current flows into the source of the lower PMOS transistor 810. For application of the power-down enable zero idle time Z-state circuit 800 shown in FIG. 8, the load is a filter connected to ground and $V_C$ for all kinds of phase-locked loops and delay-locked loops. Also, the initial $V_C$ is defined to be approximately the midpoint voltage of the sensing inverter as in the simple zero idle time Z-state circuit of FIG. 7. Also, as seen in the CMOS NAND gate 806 shown in FIG. 8, the gate terminal of the left PMOS transistor 816 is coupled to the gate terminal of the lower NMOS transistor 824, and the gate terminal of the right PMOS transistor 818 is coupled to the gate terminal of the upper NMOS transistor 820, with these device pair connections serving as inputs to the CMOS NAND gate circuit 806. The gate terminal of the left PMOS transistor 816 and the lower NMOS transistor 824 serves as the inverting power-down input and the gate terminal of the right PMOS transistor 818 and the upper NMOS transistor 820 serves as the logical input, as shown in FIG. 8. Those skilled in the art will recognize that with minor modifications, these input schemes may be reversed with the gate terminal of the left PMOS transistor 816 and the lower NMOS transistor 824 serving as the logical input and the gate terminal of the right PMOS transistor 818 and the upper NMOS transistor 820 serving as the inverting power-down input. In addition, those skilled in the art will recognize that with minor modifications, the coupling scheme may be reversed with the gate terminal of the left PMOS transistor 816 being coupled to the gate terminal of the upper NMOS transistor 820, and the gate terminal of the right PMOS transistor 818 being coupled to the gate terminal of the lower NMOS transistor 824. Hence, the reversed coupling scheme allows following input schemes: 1. The gate terminal of the left PMOS transistor 816 and the upper NMOS transistor 820 serves as the inverting power-down input and the gate terminal of the right PMOS transistor 818 and the lower NMOS transistor 824 serves as the logical input. 2. The gate terminal of the left PMOS transistor 816 and the upper NMOS transistor 820 serves as the logical input and the gate terminal of the right PMOS transistor 818 and the lower NMOS transistor 824 serves as the inverting power-down input.

If the power-down enable zero idle time Z-state circuit 800 is not used within the systems 602, 604, and 606, the values of $V_{PG}$ and $V_{CB}$ shown in FIG. 8 are not affected by the $V_C$ initially decided by the device aspect ratios of the sensing inverter 802 in the stand-alone power-down enable zero idle time Z-sate circuit assuming the widths and lengths of two PMOS transistors 808 and 810 are taken as equal. In other words, the values of $V_{PG}$ and $V_{CB}$ as well as $V_C$ will be affected after phase-locked loops, delay-locked loops, or switching regulators begin to operate normally. The initial $V_C$ will cause a substantial reduction in the difference between the initial condition and the expected condition within the systems 602, 604, and 606.

For the power-down enable zero idle time Z-state circuit of FIG. 8, it is also desirable to use a value for the midpoint voltage less than the voltage that makes the voltage-controlled oscillator's frequency (or the voltage-controlled delay line's frequency) equal to the input signal's frequency in the configuration where the voltage-controlled oscillator's frequency increases proportionally to $V_C$ formed from a filter connected to ground and $V_C$. Specifically, it must be around $V'_C - 200$ mV where $V'_C$ is $V_C$ that makes the voltage-controlled oscillator's frequency (or the voltage-controlled delay line's frequency) equal to the input signal's frequency or makes the output voltage of the switching regulators equal to the regulated output voltage. As mentioned earlier in the simple zero idle time Z-state circuit of FIG. 7, the CMOS process variations usually must be considered so that the proper value of the midpoint voltage is chosen for the power-down enable zero idle time Z-state circuit of FIG. 8.

In addition, each bulk of two PMOS transistors 808 and 810 can be connected to its own N-well to obtain better immunity from substrate noise.

To understand power down mode, the following case will be considered. Since the power-down input voltage, $V_{PD}$, becomes $V_{DD}$ for power-down mode, the output voltage of the power-down inverter, $V_{PDB}$, is zero. In other words, the lower PMOS transistor 810 is on during power-down mode and thus provides an output pull-down path to ground. Thus, $V_C$ of the power-down enable zero idle time Z-state circuit 800 is zero during power-down mode. Zero dc volt at $V_C$ ensures that no current flows into the circuits during power-down mode. During power-down mode, the voltage-controlled oscillator (or the voltage-controlled delay line's frequency) has a free-running frequency or does not oscillate for $V_C$=0. At this point, to realize this power-down mode, one should use the voltage-controlled oscillator (or the voltage-controlled delay line) whose frequency increases proportionally to $V_C$ formed from a filter connected to ground and $V_C$.

In practice, the power-down enable zero idle time Z-state circuit of the present invention 800 is used within the systems 602, 604, and 606. Assuming that three systems 602, 604, and 606, shown in FIG. 6, have power-down mode, the phase-locked loop 602 including the power-down enable zero idle time z-state circuit 800 used for the block 608 can be simply termed the zero idle time phase-locked loop 602. Likewise, the delay-locked loop 604 and the switching regulator 606 including the power-down enable zero idle time z-state circuit 800 used for the block 608 can be simply called the zero idle time delay-locked loop 604 and the zero idle time switching regulator 606, respectively.

The power-down enable zero idle time Z-state circuit 800 within the systems 602, 604, and 606 exhibits the same desirable features as the simple zero idle time Z-state circuit 700 within the systems 602, 604, and 606 exhibits. The systems 602, 604, and 606 including the power-down enable zero idle time Z-state circuit 800 have the same advantages as the systems 602, 604, and 606 including the simple zero idle time Z-state circuit 700 have. To avoid redundancy, the statement of three desirable features and the advantages is omitted here, too. The present invention offers the above advantages by simply providing a power-down enable zero idle time z-state circuit utilizing only ten transistors that all require smaller sizes of the lengths and widths of the transistor. It is noted that SPICE is used for the simulation of phase-locked loops. The conventional phase-locked loop 100 and the zero idle time phase-locked loop 602 are simulated using the same blocks except the power-down enable zero idle time z-state circuit 800. As a result, the total simulation time of the conventional phase-locked loop 100 is 20 hours and that of the zero idle time phase-locked loop 602 is 2 hours. This improvement can be accomplished by simply inserting a power-down enable zero idle time z-state circuit 800 into a conventional phase-locked loop 100, and the simulation time has been reduced by a factor of 10. Likewise, for delay-locked loops and switching regulators, the simulation time has been reduced by a factor of 10.

Figure 9:
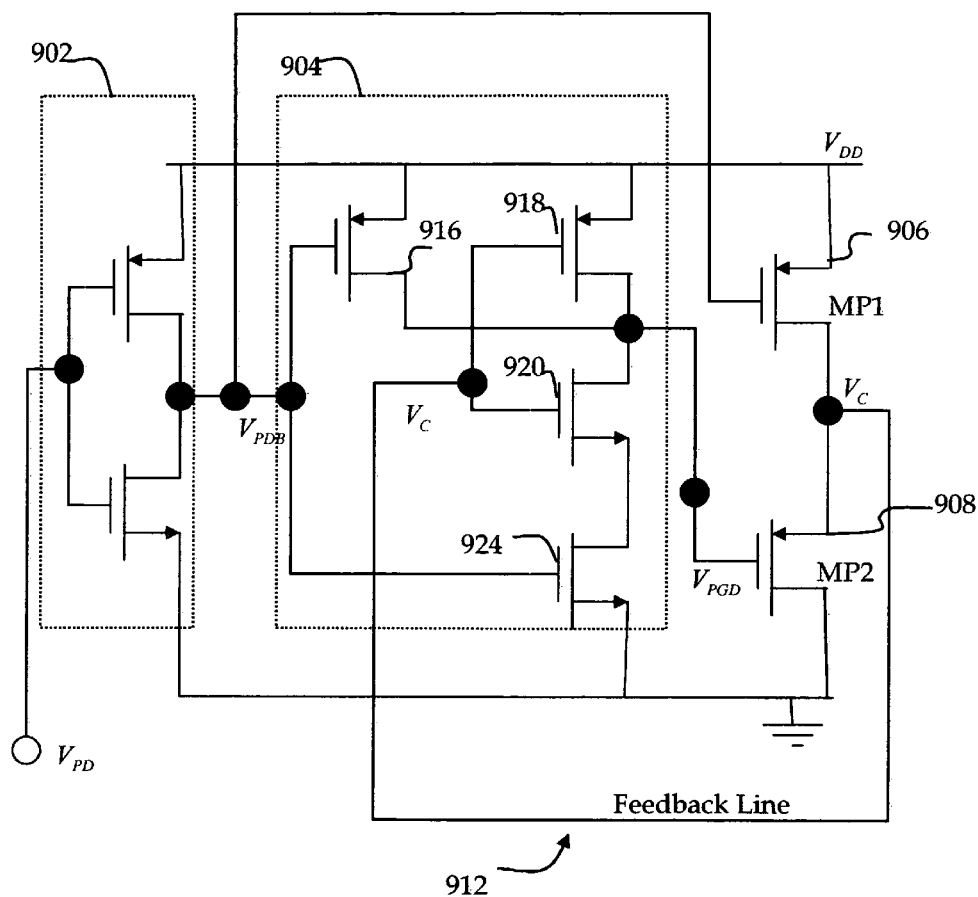
FIG. 9 illustrates a circuit diagram of a p-type power-down enable zero idle time Z-state circuit according to the present invention.

FIG. 9 illustrates a circuit diagram of a p-type power-down enable zero idle time Z-state circuit 900 according to the present invention. This p-type power-down enable zero idle time Z-state circuit 900 is the other power-down enable embodiment of the invention. The power-down input voltage, $V_{PD}$, is defines as the input voltage for the p-type power down mode as well as for the power down mode. For simplicity, p-type power down mode can also be termed the power-down mode, too.

The p-type power-down enable zero idle time Z-state circuit 900 is a feedback circuit that consists of a power-down inverter 902 (an odd number of inverters), a sensing NAND gate 904, two stacked PMOS transistors 906 and 908, and a feedback line 912. It is noted here that a two-input CMOS NAND gate 904 has the same midpoint voltage as an inverter since the two-input CMOS NAND gate can be used as an enabling inverter with one input serving as an active high enable input and the other used as the sensing input. Assuming the enable input voltage is $V_{DD}$, the midpoint voltage of the sensing CMOS NAND gate 904 is a voltage where the sensing input voltage and the output voltage of the CMOS NAND gate are equal in the voltage transfer characteristic. Thus, the midpoint voltage is decided by the device aspect ratios of the CMOS NAND gate 904.

The p-type power-down enable zero idle time Z-state circuit 900 shown in FIG. 9, where $V_C$ is the input(=output) voltage with feedback 912 applied. First, it is assumed that feedback 912 is open and thus the sensing input and output are not connected together. In other words, the input and output without feedback 912 are the sensing input of the sensing NAND gate 904 and output of two PMOS transistors 906 and 908, respectively. The sensing NAND gate 904 senses $V_{DD}$ at its sensing input when the circuit mode changes from power-down mode to normal mode after its start-up. The reason why the sensing input of the sensing NAND gate 904 is $V_{DD}$ is that the output voltage of the power-down inverter 902, $V_{PDB}$, was zero, which turned on upper PMOS transistor 906 and thus provided an output pull-up path to $V_{DD}$ during previous power-down mode. Since the power-down input voltage, $V_{PD}$, becomes zero during normal mode, the output voltage of the power-down inverter, $V_{PDB}$, is $V_{DD}$. In other words, the gate voltage of the upper PMOS transistor 906, $V_{PDB}$, is $V_{DD}$ to turn off the upper PMOS transistor 906 during normal mode. Since the active high enable input and sensing input voltage of the sensing NAND gate 904 are $V_{DD}$, the output of the sensing NAND gate 904 is at ground to turn on the lower PMOS transistor 908, which provides an output pull-down path to ground so that the output is at ground. Second, the output of two stacked PMOS transistors 906 and 908 is assumed to be connected to the sensing input of the sensing CMOS NAND gate 904. Since the sensing input voltage of the sensing CMOS NAND gate 904 becomes zero and the other enable input voltage, $V_{PDB}$, is $V_{DD}$, the output of the CMOS NAND gate 904 is at $V_{DD}$ to turn off the lower PMOS transistor 908. At this moment, two PMOS transistors 906 and 908 are off and the output is referred to as being in a high impedance Z-state. Thus, the output of two PMOS transistors 906 and 908 becomes a high impedance node that has no driving capability. However, in reality, it is noted that feedback 912 is applied in the present invention. Therefore, the feedback line 912 keeps sampling the output and feeding back the output voltage to the sensing input. Finally, the p-type power-down enable zero idle time Z-state circuit 900 in the feedback configuration provides the initial $V_C$, which is the midpoint voltage decided by the device aspect ratios of the sensing CMOS NAND gate 904. Also, it is noted that the output voltage of the sensing CMOS NAND gate 904, $V_{PGD}$, is proportional to the value of $V_C$ assuming the widths and lengths of two PMOS transistors 906 and 908 are taken as equal. As a result, a very small amount of current flows out of a load and flows into the source of the lower PMOS transistor 908 while no current flows out of the drain of the upper PMOS transistor 906. For application of the p-type power-down enable zero idle time Z-state circuit 900 shown in FIG. 9, the load is defined as a filter connected to $V_{DD}$ and $V_C$ for all kinds of phase-locked loops and delay-locked loops. The initial $V_C$ is approximately the midpoint voltage of the sensing CMOS NAND gate as that of the sensing inverter in the simple zero idle time Z-state circuit of FIG. 7 and in the power-down enable zero idle time Z-state circuit of FIG. 8. The initial $V_C$ condition will cause a substantial reduction in the difference between the initial condition and the expected condition within the systems 602, 604, and 606. Also, as seen in the sensing CMOS NAND gate 904 shown in FIG. 9, the gate terminal of the left PMOS transistor 916 is coupled to the gate terminal of the lower NMOS transistor 924, and the gate terminal of the right PMOS transistor 918 is coupled to the gate terminal of the upper NMOS transistor 920, with these device pair connections serving as inputs to the sensing CMOS NAND gate circuit 904. The gate terminal of the left PMOS transistor 916 and the lower NMOS transistor 924 serves as the inverting power-down input and the gate terminal of the right PMOS transistor 918 and the upper NMOS transistor 920 serves as the sensing input, as shown in FIG. 9. Those skilled in the art will recognize that with minor modifications, these input schemes may be reversed with the gate terminal of the left PMOS transistor 916 and the lower NMOS transistor 924 serving as the sensing input and the gate terminal of the right PMOS transistor 918 and the upper NMOS transistor 920 serving as the inverting power-down input. In addition, those skilled in the art will recognize that with minor modifications, the coupling scheme may be reversed with the gate terminal of the left PMOS transistor 916 being coupled to the gate terminal of the upper NMOS transistor 920, and the gate terminal of the right PMOS transistor 918 being coupled to the gate terminal of the lower NMOS transistor 924. Hence, the reversed coupling scheme allows following input schemes: 1. The gate terminal of the left PMOS transistor 916 and the upper NMOS transistor 920 serves as the inverting power-down input and the gate terminal of the right PMOS transistor 918 and the lower NMOS transistor 924 serves as the sensing input. 2. The gate terminal of the left PMOS transistor 916 and the upper NMOS transistor 920 serves as the sensing input and the gate terminal of the right PMOS transistor 918 and the lower NMOS transistor 924 serves as the inverting power-down input.

For the p-type power-down enable zero idle time Z-state circuit 900 shown in FIG. 9, it is also desirable to use a value for the midpoint voltage greater than the voltage that makes the voltage-controlled oscillator's frequency (or the voltage-controlled delay line's frequency) equal to the input signal's frequency or makes the output voltage of the switching regulators equal to the regulated output voltage. Specifically, the midpoint voltage can be around $V'_C$+200 mV where $V'_C$ is $V_C$ that makes the voltage-controlled oscillator's frequency (or the voltage-controlled delay line's frequency) equal to the input signal's frequency or makes the output voltage of the switching regulators equal to the regulated output voltage. As mentioned earlier in the simple zero idle time Z-state circuit of FIG. 7 and power-down enable zero idle time Z-state circuit of FIG. 8, the CMOS process variations usually must be considered so that the proper value of the midpoint voltage is chosen for the p-type power-down enable zero idle time Z-state circuit 900. In addition, each bulk of two PMOS transistors 906 and 908 can be connected to its own N-well to obtain better immunity from substrate noise.

To understand power down mode, the following case will be considered. The p-type power-down enable system is in power down mode when the power-down input voltage, $V_{PD}$, is $V_{DD}$ and it is in normal mode when $V_{PD}$ is zero. If $V_{PD}$ becomes $V_{DD}$ during power-down mode, the output voltage of the power-down inverter, $V_{PDB}$, is zero, which turns on upper PMOS transistor during power-down mode and thus provides an output pull-up path to $V_{DD}$. Thus, the $V_C$ of the p-type power-down enable zero idle time Z-state circuit 900 is $V_{DD}$. $V_C=V_{DD}$ ensures that no current flows into the circuits during power-down mode. At this point, to realize this power-down mode for all building blocks, one should use the voltage-controlled oscillator (or the voltage-controlled delay line) whose frequency decreases proportionally to $V_C$ formed from a filter connected to $V_{DD}$ and $V_C$. In other words, the voltage-controlled oscillator (or the voltage-controlled delay line's frequency) has a free-running frequency or does not oscillate when $V_C$ is $V_{DD}$. For this configuration shown in FIG. 9, $V_C$ must be $V_{DD}$ during power-down mode to ensure that no current flows into the circuits. On the contrary, it was stated earlier that $V_C$ must be zero when power-down mode occurs in FIG. 8.

In practice, the p-type power-down enable zero idle time Z-state circuit 900 of the present invention is used within the systems 602, 604, and 606. Assuming that three systems 602, 604, and 606, shown in FIG. 6, have p-type power-down mode, the phase-locked loop 602 including the p-type power-down enable zero idle time z-state circuit 900 used for the block 608 can be simply termed the zero idle time phase-locked loop 602. Likewise, the delay-locked loop 604 and the switching regulator 606 including the p-type power-down enable zero idle time z-state circuit 900 used for the block 608 can be simply called the zero idle time delay-locked loop 604 and the zero idle time switching regulator 606, respectively.

The p-type power-down enable zero idle time Z-state circuit 900 within the systems 602, 604, and 606 exhibits the same desirable features as the simple zero idle time Z-state circuit 700 and the power-down enable zero idle time Z-state circuit 800 within the systems 602, 604, and 606 exhibit. The systems including the p-type power-down enable zero idle time Z-state circuit 900 have the same advantages as the systems including the simple zero idle time Z-state circuit 700 and the power-down enable zero idle time Z-state circuit 800 have. To avoid redundancy, the statement of three desirable features and the advantages is omitted here, too. The present invention offers the above advantages by simply providing a p-type power-down enable zero idle time z-state circuit utilizing only eight transistors that all require smaller sizes of the lengths and widths of the transistor. Also, it is mentioned that SPICE is used for the simulation of phase-locked loops. The conventional phase-locked loop 100 and the zero idle time phase-locked loop 602 including the p-type power-down enable zero idle time z-state circuit 900 are simulated using the same blocks except the p-type power-down enable zero idle time z-state circuit 900. As a result, the total simulation time of the conventional phase-locked loop 100 is 20 hours and that of the zero idle time phase-locked loop 602 is 2 hours. This improvement can be accomplished by simply inserting a p-type power-down enable zero idle time z-state circuit 900 into a conventional phase-locked loop 100, and the simulation time has been reduced by a factor of about 10. Likewise, for delay-locked loops and switching regulators, the simulation time has been reduced by a factor of 10.

Figure 10:
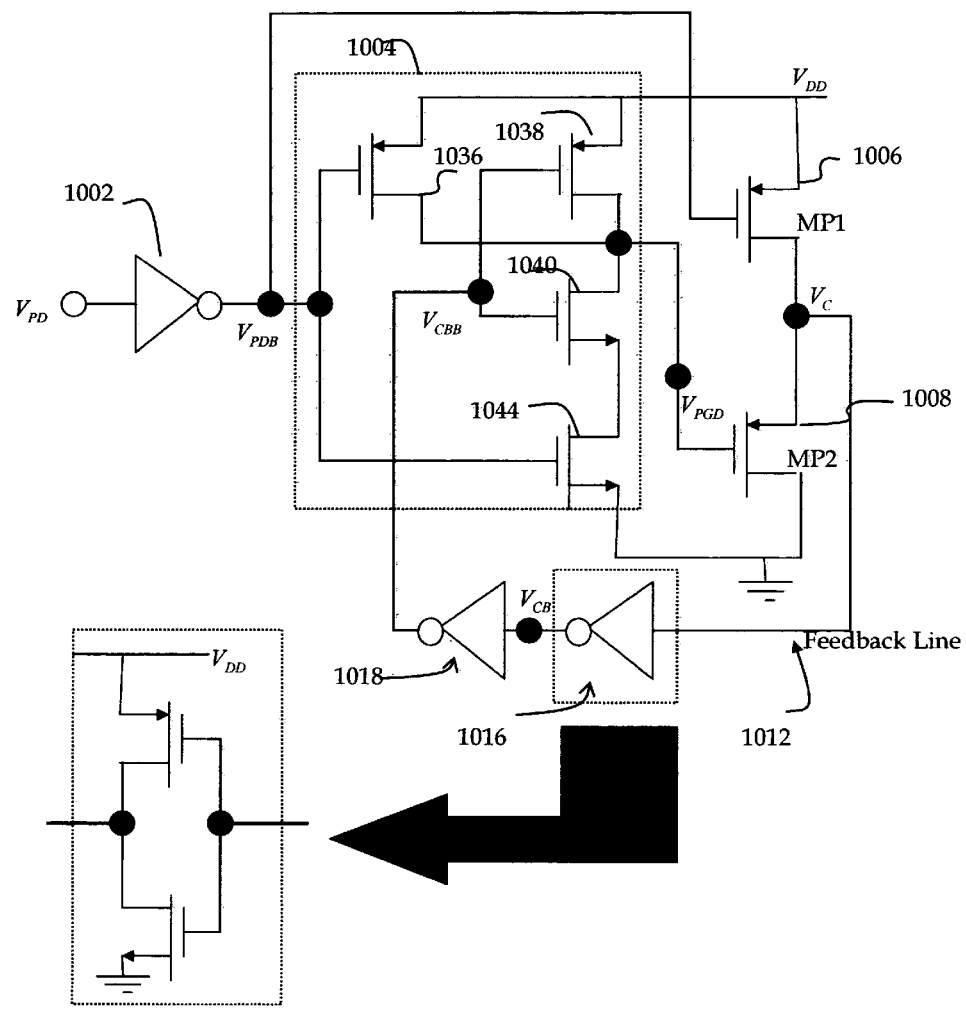
FIG. 10 illustrates a circuit diagram of a modified p-type power-down enable zero idle time Z-state circuit in accordance with the present invention.

FIG. 10 illustrates a circuit diagram of a modified p-type power-down enable zero idle time Z-state circuit 1000 in accordance with the present invention. The p-type power-down enable zero idle time Z-state circuit 1000 shown in FIG. 10 is a feedback circuit that consists of a power-down inverter 1002 (an odd number of inverters), a NAND gate 1004, a sensing inverter 1016 (an odd number of inverters), an inverter 1018 (an odd number of inverters), two stacked PMOS transistors 1006 and 1008, and a feedback line 1012. This circuit is a modification of the circuit described in FIG. 9 and has two other additional inverters compared to FIG. 9.

The modified p-type power-down enable zero idle time Z-state circuit 1000 shown in FIG. 10, where $V_C$ is the input(=output) voltage with feedback 1012 applied. First, to understand the operation of the modified p-type power-down enable zero idle time Z-state circuit 1000, it is necessary to make the assumption that feedback 1012 is open and thus the input and output are not connected each other. The sensing inverter 1016 senses at $V_{DD}$ its sensing input when the circuit mode changes from power-down mode to normal mode after its start-up. The reason why the sensing input of the sensing inverter 1016 is $V_{DD}$ is that the output voltage of the power-down inverter 1002, $V_{PDB}$, was zero, which turned on upper PMOS transistor 1006 and thus provided an output pull-up path to $V_{DD}$ during previous power-down mode. Since the power-down input voltage, $V_{PD}$, becomes zero during normal mode, the output voltage of the power-down inverter 1002, $V_{PDB}$, is $V_{DD}$. Thus, the gate voltage of the upper PMOS transistor 1006, $V_{PDB}$, is $V_{DD}$ to turn off the upper PMOS transistor 1006 during normal mode. At the same time, since the input of the sensing inverter 1016 is at $V_{DD}$, the output voltage of the second inverter 1018 is $V_{DD}$. With two input voltages, $V_{PDB}=V_{DD}$ and $V_{CBB}=V_{DD}$, the output of the CMOS NAND gate 1004 is at ground to turn on the lower PMOS transistor 1008, which provides an output pull-down path to ground so that the output is at ground. Second, the output of two stacked PMOS transistors 1006 and 1008 is assumed to be connected to the input of the sensing inverter 1016. Since the input voltage of the sensing inverter 1016 becomes zero, the output voltage of the second inverter 1018, $V_{CBB}$, is zero. Also, the output voltage of the power-down inverter 1002, $V_{PDB}$ is $V_{DD}$ during normal mode. With two input voltages, $V_{PDB}=V_{DD}$ and $V_{CBB}=0$, the output of the CMOS NAND gate 1004 is at $V_{DD}$ to turn off the lower PMOS transistor 1008. At this moment, two PMOS transistors 1006 and 1008 are off and the output is referred to as being in a high impedance Z-state. However, in reality, it is noted that feedback 1012 is applied in the present invention. Therefore, the feedback line 1012 keeps sampling the output and feeding back the output voltage to the sensing input. Finally, the modified p-type power-down enable zero idle time Z-state circuit 1000 in the feedback configuration provides the initial $V_C$, which is approximately the midpoint voltage decided by the device aspect ratios of the sensing inverter 1016. It should be noted that the operation and principles of the circuit shown in FIG. 10 are the same as those of the circuit shown in FIG. 9. However, the difference to note here in FIG. 10 is to utilize an inverter to sense $V_C$. In other words, the NAND gate 904 shown in FIG. 9 was used as a sensing gate, but the NAND gate 1004 shown in FIG. 10 does not function as a sensing gate any more. Also, it is interesting to note that, the output voltage of the sensing inverter 1016, $V_{CB}$, becomes nearly equal to $$\frac{V_{DD}}{2}$$

and the output voltage of the NAND gate 1004, $V_{PGD}$, is proportional to the value of $V_C$ assuming the widths and lengths of two PMOS transistors 1006 and 1008 are taken as equal. As a result, a very small amount of current flows out of a load and flows into the source of the lower PMOS transistor 1008 while no current flows out of the drain of the upper PMOS transistor 1006. For application of the modified p-type power-down enable zero idle time Z-state circuit 1000 shown in FIG. 10, the load is defined as a filter connected to $V_{DD}$ and $V_C$ for all kinds of phase-locked loops and delay-locked loops. The initial $V_C$ condition will cause a substantial reduction in the difference between the initial condition and the expected condition within the systems 602, 604, and 606. Also, as seen in the CMOS NAND gate 1004 shown in FIG. 10, the gate terminal of the left PMOS transistor 1036 is coupled to the gate terminal of the lower NMOS transistor 1044, and the gate terminal of the right PMOS transistor 1038 is coupled to the gate terminal of the upper NMOS transistor 1040, with these device pair connections serving as inputs to the CMOS NAND gate circuit 1004. The gate terminal of the left PMOS transistor 1036 and the lower NMOS transistor 1044 serves as the inverting power-down input and the gate terminal of the right PMOS transistor 1038 and the upper NMOS transistor 1040 serves as the logical input, as shown in FIG. 10. Those skilled in the art will recognize that with minor modifications, these input schemes may be reversed with the gate terminal of the left PMOS transistor 1036 and the lower NMOS transistor 1044 serving as the logical input and the gate terminal of the right PMOS transistor 1038 and the upper NMOS transistor 1040 serving as the inverting power-down input. In addition, those skilled in the art will recognize that with minor modifications, the coupling scheme may be reversed with the gate terminal of the left PMOS transistor 1036 being coupled to the gate terminal of the upper NMOS transistor 1040, and the gate terminal of the right PMOS transistor 1038 being coupled to the gate terminal of the lower NMOS transistor 1044. Hence, the reversed coupling scheme allows following input schemes: 1. The gate terminal of the left PMOS transistor 1036 and the upper NMOS transistor 1040 serves as the inverting power-down input and the gate terminal of the right PMOS transistor 1038 and the lower NMOS transistor 1044 serves as the logical input. 2. The gate terminal of the left PMOS transistor 1036 and the upper NMOS transistor 1040 serves as the logical input and the gate terminal of the right PMOS transistor 1038 and the lower NMOS transistor 1044 serves as the inverting power-down input.

For the modified p-type power-down enable zero idle time Z-state circuit 1000 shown in FIG. 10, the midpoint voltage can be around $V'_C+200$ mV where $V'_C$ is $V_C$ that makes the voltage-controlled oscillator's frequency (or the voltage-controlled delay line's frequency) equal to the input signal's frequency or makes the output voltage of the switching regulators equal to the regulated output voltage. As mentioned in the simple zero idle time Z-state circuit of FIG. 7, the power-down enable zero idle time Z-state circuit of FIG. 8, and the p-type power-down enable zero idle time Z-state circuit of FIG. 9, the CMOS process variations usually must be considered so that the proper value of the midpoint voltage is chosen for the modified p-type power-down enable zero idle time Z-state circuit shown in FIG. 10. In addition, each bulk of two PMOS transistors 1006 and 1008 can be connected to its own N-well to obtain better immunity from substrate noise.

The p-type power-down enable system is in power down mode when the power-down input voltage, $V_{PD}$, is $V_{DD}$ and it is in normal mode when $V_{PD}$ is zero. If $V_{PD}$ becomes $V_{DD}$ during power-down mode, the output of the power-down inverter 1002, $V_{PDB}$, is at ground, which turns on upper PMOS transistor 1006 and thus provides an output pull-up path to $V_{DD}$ during power-down mode. Thus, the $V_C$ of the modified p-type power-down enable zero idle time Z-state circuit 1000 is $V_{DD}$. $V_C=V_{DD}$ ensures that no current flows into the circuits during power-down mode. At this point, to realize this power-down mode for all building blocks, one should use the voltage-controlled oscillator (or the voltage-controlled delay line) whose frequency decreases proportionally to $V_C$ formed from a filter connected to $V_{DD}$ and $V_C$. The modified p-type power-down enable zero idle time Z-state circuit 1000 is intended for the voltage-controlled oscillator (or the voltage-controlled delay line's frequency) that has a free-running frequency or does not oscillate for $V_C=V_{DD}$.

In practice, the modified p-type power-down enable zero idle time Z-state circuit 1000 of the present invention is used within the systems 602, 604, and 606. Assuming that three systems 602, 604, and 606, shown in FIG. 6, have p-type power-down mode, the phase-locked loop 602 including the modified p-type power-down enable zero idle time z-state circuit 1000 used for the block 608 can be simply termed the zero idle time phase-locked loop 602. Likewise, the delay-locked loop 604 and the switching regulator 606 including the modified p-type power-down enable zero idle time z-state circuit 1000 used for the block 608 can be simply called the zero idle time delay-locked loop 604 and the zero idle time switching regulator 606, respectively.

The modified p-type power-down enable zero idle time Z-state circuit 1000 within the systems 602, 604, and 606 exhibits the same desirable features as the simple zero idle time Z-state circuit 700, the power-down enable zero idle time Z-state circuit 800, and the p-type power-down enable zero idle time Z-state circuit 900 within the systems 602, 604, and 606 exhibit. The systems including the modified p-type power-down enable zero idle time Z-state circuit 1000 have the same advantages as the systems including the simple zero idle time Z-state circuit 700, the power-down enable zero idle time Z-state circuit 800, and the p-type power-down enable zero idle time Z-state circuit 900 have. To avoid redundancy, the statement of three desirable features and the advantages is omitted here, too. The present invention offers the above advantages by simply providing a modified p-type power-down enable zero idle time z-state circuit 1000 utilizing only twelve transistors that all require smaller sizes of the lengths and widths of the transistor. Also, it is mentioned that SPICE is used for the simulation of phase-locked loops. The simulation times of the conventional phase-locked loop 100 and zero idle time phase-locked loop 602 including the modified p-type power-down enable zero idle time z-state circuit 1000 are simulated using the same blocks except the circuit of FIG. 10. As a result, the simulation time of the zero idle time phase-locked loop 602 has been reduced by a factor of about 10. This improvement can be accomplished by simply inserting a cost-effective circuit 1000 into a conventional phase-locked loop 100. Likewise, for delay-locked loops and switching regulators, the simulation time has been reduced by a factor of 10.

In summary, without regard to the power-down mode type of three systems 602, 604, and 606, shown in FIG. 6, the phase-locked loop 602 including FIG. 7, FIG. 8, FIG. 9, or FIG. 10 used for the block 608 can be simply termed the zero idle time phase-locked loop 602 for convenience. Likewise, the delay-locked loop 604 and the switching regulator 606 including FIG. 7, FIG. 8, FIG. 9, or FIG. 10 can be simply called the zero idle time delay-locked loop 604 and the zero idle time switching regulator 606, respectively.

The four types of the zero idle time Z-state circuits 700, 800, 900, and 1000 of the present invention within the systems 602, 604, and 606 exhibits three desirable features as follows: 1. The frequency of the voltage-controlled oscillator is forced to be closer to the input signal's frequency so that the zero idle time phase-locked loop becomes quickly locked. 2. The frequency of the voltage-controlled delay line is forced to be closer to the input signal's frequency so that the zero idle time delay-locked loop is quickly locked. 3. The initial output voltage of switching regulator is forced to be closer to its regulated output voltage so that the zero idle time switching regulator quickly comes in regulations. The systems including four types of the zero idle time Z-state circuits 700, 800, 900, and 1000 have the following advantages: a fast lock-in time for phase-locked loops and delay-locked loops, a solution for harmonic locking problem of phase-locked loops, a prevention of delay-locked loops from failing to lock, a minimization of start-up time of switching regulators, a reduction in power and time consumption until lock or regulation, a significant reduction in design time for better time-to-market, a higher performance, and an improvement in productivity by reusing the same cost-effective circuit for the systems 602, 604, and 606 such as zero idle time phase-locked loop, zero idle time delay-locked loop, and zero idle time switching regulator. So far, it should be noted that the same time step has been used for the SPICE simulation in order to accurately measure and compare the simulation time of all circuits.

The present invention, four types of the zero idle time Z-state circuits, simply utilizes a Z-state circuit instead of using complicated functional systems such as proportional integral controller or successive approximation registers in order to reduce the cost, inefficiency, power, time, and complexity of conventional fast-locking systems 200 and 400, and simply inserts a cost-effective Z-state circuit into the conventional switching regulator 500 in order to achieve many advantages. While the present invention has been described in particular embodiments, it should be appreciated that the present invention should not be construed as being limited by such embodiments, but rather construed according to the claims below.

What is claimed is:

1. A power-down enable zero idle time Z-state circuit for making three systems become three zero idle time systems, comprising:
   a feedback line connected with the output and input of the power-down enable zero idle time Z-state circuit;
   a sensing inverter for sensing a voltage at the feedback line and generating a midpoint voltage decided by the device aspect ratios of the sensing inverter;
   a power-down inverter for forcing the feedback line to be at ground so that no current flows during power-down mode;
   a two-input CMOS NAND gate for being used as an enabling inverter with one input serving as an inverting power-down input and the other used as the inverting sensing input;
   a lower PMOS transistor for being completely turned off during normal mode and being completely turned on during power-down mode, wherein its gate terminal is coupled to the output of the power-down inverter; and
   an upper PMOS transistors for being incompletely turned off during normal mode, in response to the output of the CMOS NAND gate.

2. The circuit as recited in claim 1 wherein the feedback line is at ground to ensure that no current flows into the circuit when the power-down input is at the power supply.

3. The circuit as recited in claim 1 wherein the power-down enable zero idle time Z-state circuit can be a simple zero idle time Z-state circuit if the gate terminal of the lower PMOS transistor is coupled to power supply by eliminating the power-down inverter and replacing the CMOS NAND gate by an inverter.

4. The circuit as recited in claim 1 wherein the sensing inverter can comprise an odd number of sensing inverters such an sensing inverter, three sensing inverters, five sensing inverters, and seven sensing inverters.

5. The circuit as recited in claim 1 wherein the power-down enable zero idle time Z-state circuit can be inserted into a phase-locked loop, delay-locked loop, or switching regulator.

6. The circuit as recited in claim 5 wherein the phase-locked loop consists of a phase-frequency detector, a charge-pump, a low-pass filter, a voltage-controlled oscillator, and a frequency divider in a loop.

7. The circuit as recited in claim 5 wherein the delay-locked loop consists of a phase detector, a charge-pump, a loop filter, and a voltage-controlled delay line.

8. The circuit as recited in claim 6 wherein the output of the charge-pump and low-pass filter is connected to the feedback line of the power-down enable zero idle time Z-state circuit.

9. The circuit as recited in claim 7 wherein the output of the charge-pump and loop filter is connected to the feedback line of the power-down enable zero idle time Z-state circuit.

10. The circuit as recited in claim 6 wherein the phase-locked loop has a voltage-controlled oscillator whose frequency increases proportionally to the output voltage of the filter.

11. The circuit as recited in claim 7 wherein the delay-locked loop has a voltage-controlled delay line whose frequency increases proportionally to the output voltage of the filter.

12. A p-type power-down enable zero idle time Z-state circuit for making three systems become three zero idle time systems, comprising:
    a feedback line connected with the output and input of the p-type power-down enable zero idle time Z-state circuit;
    a sensing inverter for sensing a voltage at the feedback line and generating midpoint voltage decided by the device aspect ratios of the sensing inverter;
    a power-down inverter for forcing the feedback line to be at power supply so that no current flows during power-down mode;
    a two-input CMOS NAND gate for being used as an enabling inverter with one input serving as an inverting power-down input and the other used as the non-inverting sensing input;
    an upper PMOS transistor for being completely turned off during normal mode and being completely turned on during power-down mode, wherein its gate terminal is coupled to the output of the power-down inverter; and
    a lower PMOS transistors for being incompletely turned off during normal mode, in response to the output of the CMOS NAND gate.

13. The circuit as recited in claim 12 wherein the feedback line is at power supply to ensure that no current flows into the p-type power-down enable zero idle time Z-state circuit when the power-down input is at the power supply.

14. The circuit as recited in claim 12 wherein the sensing inverter can comprise an even number of sensing inverters such as null, two sensing inverters, four sensing inverters, six sensing inverters, and eight sensing inverters.

15. The circuit as recited in claim 12 wherein the CMOS NAND gate functions as the sensing gate and thus the device aspect ratios of the sensing CMOS NAND gate decide the midpoint voltage if the sensing inverter does not exist.

16. The circuit as recited in claim 12 wherein the p-type power-down enable zero idle time Z-state circuit can be inserted into a phase-locked loop, delay-locked loop, or switching regulator.

17. The circuit as recited in claim 16 wherein the phase-locked loop consists of a phase-frequency detector, a charge-pump, a low-pass filter, a voltage-controlled oscillator, and a frequency divider in a loop.

18. The circuit as recited in claim 16 wherein the delay-locked loop consists of a phase detector, a charge-pump, a loop filter, and a voltage-controlled delay line.

19. The circuit as recited in claim 17 wherein the phase-locked loop has a voltage-controlled oscillator whose frequency decreases proportionally to the output voltage of the filter.

20. The circuit as recited in claim 18 wherein the delay-locked loop has a voltage-controlled delay line whose frequency decreases proportionally to the output voltage of the filter.

* * * * *